(12) United States Patent
Jo et al.

(10) Patent No.: US 12,380,935 B2
(45) Date of Patent: Aug. 5, 2025

(54) SEMICONDUCTOR MEMORY DEVICE AND OPERATION METHOD THEREOF

(71) Applicant: SAMSUNG ELECTRONICS CO., LTD., Suwon-si (KR)

(72) Inventors: Byoungkon Jo, Suwon-si (KR); Gyesik Oh, Suwon-si (KR); Wangyong Im, Suwon-si (KR); Duk Sung Kim, Suwon-si (KR); Jangseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 18/144,531

(22) Filed: May 8, 2023

(65) Prior Publication Data
US 2024/0177750 A1 May 30, 2024

(30) Foreign Application Priority Data
Nov. 29, 2022 (KR) .................... 10-2022-0162346

(51) Int. Cl.
*G11C 5/06* (2006.01)
*G11C 7/10* (2006.01)
*G11C 5/02* (2006.01)

(52) U.S. Cl.
CPC .............. *G11C 7/1096* (2013.01); *G11C 5/06* (2013.01); *G11C 7/1039* (2013.01);
(Continued)

(58) Field of Classification Search
CPC ....... G11C 7/1096; G11C 5/06; G11C 7/1039; G11C 7/1093
(Continued)

(56) References Cited

U.S. PATENT DOCUMENTS 6,088,253 A 7/2000 Shimizu
6,212,091 B1 4/2001 Kawabata et al.
(Continued)

FOREIGN PATENT DOCUMENTS

KR 10-0894811 B1 4/2009

OTHER PUBLICATIONS

Lee et al., A Study on Memory Stack Process by Hybrid Copper Bonding (HCB) Technology, 2022 IEEE 72nd Electronic Components and Technology Conference (ECTC), May 31, 2022, (5 total pages).
(Continued)

*Primary Examiner* — Ly D Pham
(74) *Attorney, Agent, or Firm* — Sughrue Mion, PLLC

(57) ABSTRACT

A semiconductor memory device, includes, a cell array including a plurality of memory banks, a command decoder configured to decode a read/write command, a read command, and a write command that are input from outside of the semiconductor memory device, an address decoder receiving a read address and a write address, an input receiver configured to transmit write data input through a write data pad to a global input/output driver of a memory bank corresponding to the write address, and an output driver configured to transmit read data output from an input/output sense amplifier of a memory bank corresponding to the read address to a read data pad, wherein the write data is input via the write data pad in a single data rate method and transmitted to the global input/output driver without deserialization processing, and the read data is transmitted from the input/output sense amplifier to the read data pad without serialization processing. In some embodiments, the semiconductor memory device is electrically and physically coupled to a central processing unit by hybrid copper bonding.

18 Claims, 11 Drawing Sheets

(52) U.S. Cl.
CPC ............ *G11C 7/1093* (2013.01); *G11C 5/025* (2013.01); *G11C 7/1075* (2013.01)

(58) Field of Classification Search
USPC .................................................. 365/189.011
See application file for complete search history.

(56) References Cited

U.S. PATENT DOCUMENTS

| | | | |
|---|---|---|---|
| 6,430,089 B2 | 8/2002 | Ayukawa et al. | |
| 6,744,657 B2 | 6/2004 | Agata | |
| 6,826,088 B2 | 11/2004 | Sohn et al. | |
| 7,184,347 B2 | 2/2007 | Lee et al. | |
| 7,626,523 B2 | 12/2009 | Shin et al. | |
| 8,031,505 B2 * | 10/2011 | Kang ....................... | G11C 5/02 365/51 |
| 11,264,084 B2 | 3/2022 | Kim et al. | |
| 2001/0002177 A1 | 5/2001 | Ayukawa et al. | |
| 2003/0053360 A1 | 3/2003 | Agata | |
| 2004/0141399 A1 | 7/2004 | Sohn et al. | |
| 2006/0023483 A1 | 2/2006 | Lee et al. | |
| 2007/0109909 A1 | 5/2007 | Jung | |
| 2008/0169946 A1 | 7/2008 | Shin et al. | |
| 2014/0059304 A1 | 2/2014 | Iwai et al. | |
| 2014/0173238 A1 * | 6/2014 | Ware ....................... | H04L 9/065 711/163 |
| 2017/0365326 A1 * | 12/2017 | Cha ....................... | G11C 11/4096 |
| 2021/0118487 A1 | 4/2021 | Kim et al. | |
| 2022/0189530 A1 | 6/2022 | Ishii | |

OTHER PUBLICATIONS

Communication issued Mar. 5, 2024 issued by the European Patent Office in European Application No. 23196181.4.
Communication issued on Feb. 4, 2025 by the European Patent Office in European Patent Application No. 23196181.4.
Communication dated Mar. 18, 2025, issued by the European Patent Office in European Application No. 23196181.4.

* cited by examiner

SEMICONDUCTOR MEMORY DEVICE AND OPERATION METHOD THEREOF

CROSS-REFERENCE TO RELATED APPLICATIONS

This application claims priority under 35 U.S.C. § 119 to Korean Patent Application No. 10-2022-0162346 filed on Nov. 29, 2022, in the Korean Intellectual Property Office, the disclosures of which is incorporated by reference herein in its entirety.

BACKGROUND

The present disclosure relates to a semiconductor memory device, and more particularly, to a semiconductor memory device capable of providing low latency and high bandwidth using an advanced packaging method and an operating method thereof.

A semiconductor package is an integrated circuit chip implemented in a form suitable for use in electronic products. In general, a semiconductor package generally mounts semiconductor chips on a printed circuit board and electrically connects them using bonding wires or bumps. With the development of the electronic industry, research is being conducted to mount semiconductors with various functions in one package. In addition, various studies are being conducted to improve the reliability and miniaturization of semiconductor packages.

With the high integration and high performance of semiconductor devices, they have a fine pitch, and high-speed connection between semiconductor chips is required in many cases. For high-speed connection, a connection path needs to be shortened, but there is a limit to shortening the signal transmission path in the conventional method using micro bumps. In order to overcome the weakness of micro bumps, a technology called Hybrid Copper Bonding HCB is applied to electrically connect chips without using micro bumps. However, it is difficult to fully utilize the advantages of hybrid copper bonding HCB or advanced packaging methods in the input/output structure of existing semiconductor memory devices.

SUMMARY

Embodiments of the present disclosure provide a solid state drive capable of determining an optimal throttling delay time and a throttling method thereof.

According to an aspect of an example embodiment, a semiconductor memory device, comprising, a cell array including a plurality of memory banks, a command decoder configured to decode a read/write command, a read command, and a write command that are input from outside of the semiconductor memory device, an address decoder receiving a read address and a write address, an input receiver configured to transmit write data input through a write data pad to a global input/output driver of a first memory bank corresponding to the write address, and an output driver configured to transmit read data output from an input/output sense amplifier of a second memory bank corresponding to the read address to a read data pad, wherein the write data is input via the write data pad in a single data rate method and transmitted to the global input/output driver without deserialization processing, and the read data is transmitted from the input/output sense amplifier to the read data pad without serialization processing.

According to an aspect of an example embodiment, a method of operating a semiconductor memory device connected to an external device through hybrid copper bonding, the method comprising, receiving a first command, a first write address, a first read address, and a first write data during a first clock cycle, receiving a second command during a second clock cycle, and outputting first read data corresponding to the first read address during the second clock cycle.

According to an aspect of an example embodiment, a semiconductor memory device, comprising, a plurality of memory banks, a command decoder configured to decode a read/write command, a read command, and a write command input from a central processing unit, and an input receiver configured to transmit write data input through a write data pad to a global input/output driver of a memory bank corresponding to a write address, wherein the write data is input during a same clock cycle as the read/write command or the write command.

BRIEF DESCRIPTION OF THE DRAWINGS

The above and other aspects and features of the present disclosure will become apparent by describing in detail embodiments thereof with reference to the accompanying drawings.

DETAILED DESCRIPTION

It is to be understood that both the foregoing general description and the following detailed description are example. Reference signs are indicated in detail in preferred embodiments, examples of which are indicated in the reference drawings. Wherever possible, the same reference numbers are used in the description and drawings to refer to the same or like parts.

Hereinafter, dynamic random access memory (DRAM) will be used as an example of a semiconductor memory device for explaining the features and functions of embodiments. However, those skilled in the art will readily appreciate other advantages and capabilities of embodiments in light of the disclosure herein. Concepts disclosed herein may be implemented or applied through other embodiments. In addition, the detailed description may be modified or changed according to viewpoints and applications without significantly departing from the scope, spirit, and other objectives of the embodiments.

Figure 1:
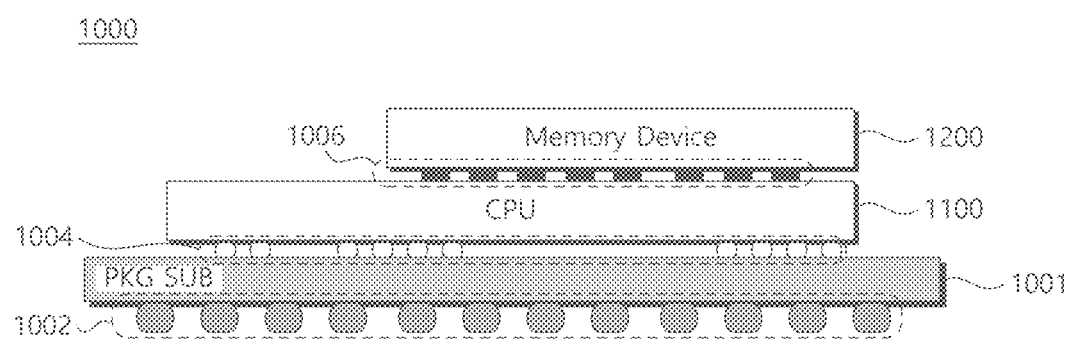
FIG. 1 is a cross-sectional view showing a memory system according to an example embodiment.

FIG. 1 is a cross-sectional view showing a memory system according to an example embodiment. Referring to FIG. 1, a memory system 1000 implemented as a stacked memory may include a package substrate 1001, a CPU 1100, and a memory device 1200.

The package substrate 1001 may serve as a channel electrically connecting devices stacked inside the memory system 1000 and external devices. To this end, bumps 1004 may be attached to an upper portion of the package substrate 1001 and solder balls 1002 may be attached to a lower portion of the package substrate 1001. For example, bumps 1004 may be flip-chip bumps. The CPU 1100 may be stacked on the package substrate 1001 through the bumps 1004. The memory system 1000 may transmit and receive signals to and from other external packages or semiconductor devices through the solder balls 1002. For example, the package substrate 1001 may be a printed circuit board PCB.

The CPU 1100 may perform an operation using the memory device 1200 as at least one of a main memory, an operation memory, and a cache memory. The CPU 1100 may execute applications supported by the memory system 1000 using the memory device 1200 stacked thereon. For example, the CPU 1100 may execute specialized operations by including at least one of a system on chip (SoC), an Application Processor (AP), a Graphic Processing Unit (GPU), a Neural Processing Unit (NPU), a Tensor Processing Unit (TPU), a Vision Processing Unit (VPU), an image signal processor (ISP) and a digital signal processor (DSP). In another embodiment, the CPU 1100 may include a memory controller (not shown) for controlling the memory device 1200. The memory controller may control overall operations of the memory device 1200.

The memory device 1200 may write data or output the written data under the control of the CPU 1100. When the memory device 1200 includes a DRAM, the CPU 1100 operates the memory device 1200 according to communication protocols such as single data rate (SDR), double data rate (DDR), and low power DDR (LPDDR). For example, to read data stored in the memory device 1200, the CPU 1100 transmits a command and an address to the memory device 1200. The memory device 1200 may include at least one of DRAM, SDRAM, NAND flash memory, NOR flash memory, phase-change RAM (PRAM), resistive RAM (ReRAM), ferroelectric RAM (FRAM), and spin-torque magnetic RAM (STT-MRAM).

The memory device 1200 and the CPU 1100 may be electrically and physically coupled by a hybrid copper bonding (1006, HCB). To form the hybrid copper bonding 1006, for example, metal-to-metal bonding may be directly performed, or dielectric layers (dielectric-to-dielectric) contacting each other may be directly bonded. That is, at least some of the upper surface pads of the CPU 1100 formed of copper may be directly bonded to at least some of the pads on the lower surface of the memory device 1200 formed of copper. Similarly, the upper dielectric layer of the CPU 1100 may be directly bonded to the lower dielectric layer of the memory device 1200. Through the hybrid copper bonding 1006, bumps and polymer layers can be removed, a multi-level stack without a vertical gap is possible, and the overall package thickness of the memory system 1000 can be reduced. In addition, signal transmission speed between the memory device 1200 and the CPU 1100 may be improved.

To connect the CPU 1100 and the memory device 1200 through the hybrid copper bonding 1006, the memory device 1200 has a modified command combination and data path structure. That is, the memory device 1200 may receive a command for simultaneously transmitting a read request and a write request through one command. This command will be referred to as multi-command. Of course, the memory device 1200 may also process a command for transmitting only a read request and a command for transmitting only a write request.

In addition, the memory device 1200 includes independent write data paths and read data paths. Conventionally, one data path (e.g., DQ) has been used as a read data path or a write data path depending on the mode, but the memory device 1200 can support full duplex access capable of reading and writing at the same time. In addition, since a serializer and a deserializer of an input/output data path can be removed from the memory device 1200, low latency, reduced chip area, and low-power design are possible.

Figure 2:
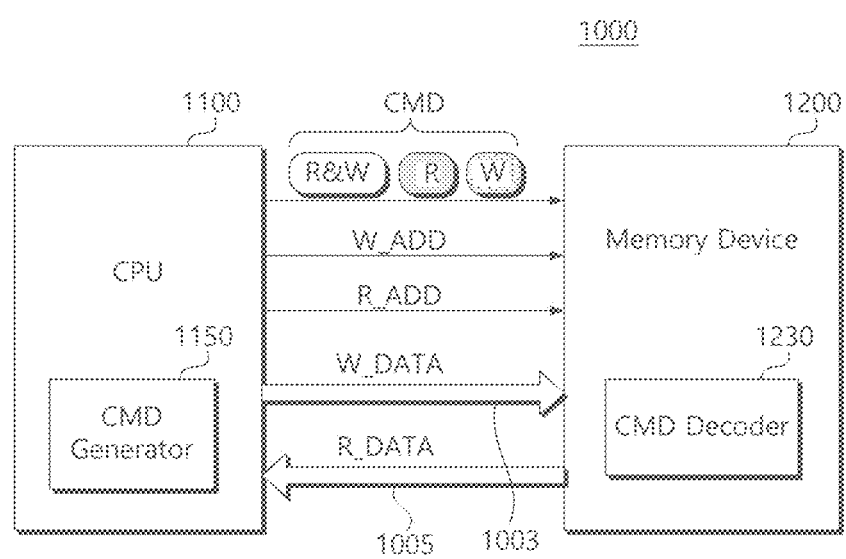
FIG. 2 is a block diagram illustrating a memory system including a memory device according to an example embodiment.

FIG. 2 is a block diagram illustrating a memory system including a memory device according to an example embodiment. Referring to FIG. 1, a memory system 1000 may include a CPU 1100 and a memory device 1200.

The CPU 1100 may perform an access operation of writing data to the memory device 1200 or reading data stored in the memory device 1200. The CPU 1100 may generate a command CMD and an address for writing data into the memory device 1200 or reading data stored in the memory device 1200. The CPU 1100 may be at least one of a memory controller for controlling the memory device 1200, a system on chip SoC such as an application processor AP, a CPU, and a GPU.

In particular, the CPU 1100 generates a read/write command (R&W), a read command (R), and a write command (W) to access the memory device 1200. For generation of commands, the CPU 1100 may include an command generator 1150. The command generator 1150 generates a read/write command (R&W), which is a multiple command including both a read request and a write request in one command. When the read/write command R&W is provided, the read address R_ADD and the write address W_ADD are simultaneously provided to the memory device 1200. In addition, when the read/write command R&W is provided, the write data W_DATA is provided to the memory device 1200 through the write data path 1003. In embodiments, the CPU 1100 separately and independently manages the write data path 1003 and the read data path 1005 of the memory device 1200. Also, the CPU 1100 will use the address lines separately according to the write address W_ADD and the read address R_ADD. Each of the write data path 1003 and the read data path 1005 may be implemented with, for example, 512 (64-Byte) lines, the size of a cache line of the CPU 1100.

The memory device 1200 outputs read data R_DATA requested by the CPU 1100 to the CPU 1100 or stores write data W_DATA requested by the CPU 1100 in a memory cell. In particular, the memory device 1200 is electrically and physically connected to the CPU 1100 according to a hybrid copper bonding HCB. Through such hybrid copper bonding HCB, the CPU 1100 and the memory device 1200 may be packaged in a multi-level stack with a minimized gap without conventional bumps and polymer layers.

In addition, the memory device 1200 may receive multiple commands that simultaneously request reading and writing through one command. That is, the memory device 1200 can simultaneously receive one read/write command R&W, a read address R_ADD, a write address W_ADD, and write data W_DATA. Of course, the memory device 1200 may simultaneously receive a read command R and a read address R_ADD for a read request. Similarly, the memory device 1200 may simultaneously receive a write command W for a write request, a write address W_ADD, and write data W_DATA.

The memory device 1200 may include a command decoder 1230 for decoding read/write command R&W, read command R, and write command W from the CPU 1100. By means of the command decoder 1230, the memory device 1200 can interpret read/write command R&W corresponding to multiple commands and simultaneously perform read and write operations.

The memory device 1200 includes an independent write data path 1003 and a read data path 1005. The memory device 1200 may support full duplex input/output capable of simultaneously reading and writing through independent write data paths 1003 and read data paths 1005. Also, since the memory device 1200 does not include a serializer and a deserializer for data input/output, data input/output latency may be reduced. In addition, it is possible to reduce the chip size of the memory device 1200 and improve low-power performance by removing a serializer and a deserializer that occupy a relatively large area.

Here, the memory device 1200 may be a high bandwidth memory (hereinafter referred to as HBM) or a next-generation DRAM (e.g., LPDDR6 or LPDDR7) that operates at ultra-speed. The memory device 1200 may be a semiconductor memory device in a system-in-package (SiP). Alternatively, the memory device 1200 may also be a volatile memory device such as Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), and static random access memory (SRAM). Alternatively, the memory device 1200 may be a nonvolatile memory device such as a resistive RAM (RRAM), a phase change memory (PRAM), a magnetoresistive memory (MRAM), a ferroelectric memory (FRAM), a spin injection magnetization reversal memory (STT-RAM), and the like. Embodiments have been described based on DRAM, but the technical spirit of the present disclosure is not limited thereto.

As described above, data I/O latency can be reduced according to the characteristics of the memory device 1200. In addition, full duplex of read and write operations can be implemented through the separation of the write data path 1003 and the read data path 1005, so that memory bandwidth can be increased. In addition, the memory device 1200 can achieve a reduced chip area and high power efficiency as components for serialization and parallelization are removed from a data input/output path.

Figure 3:
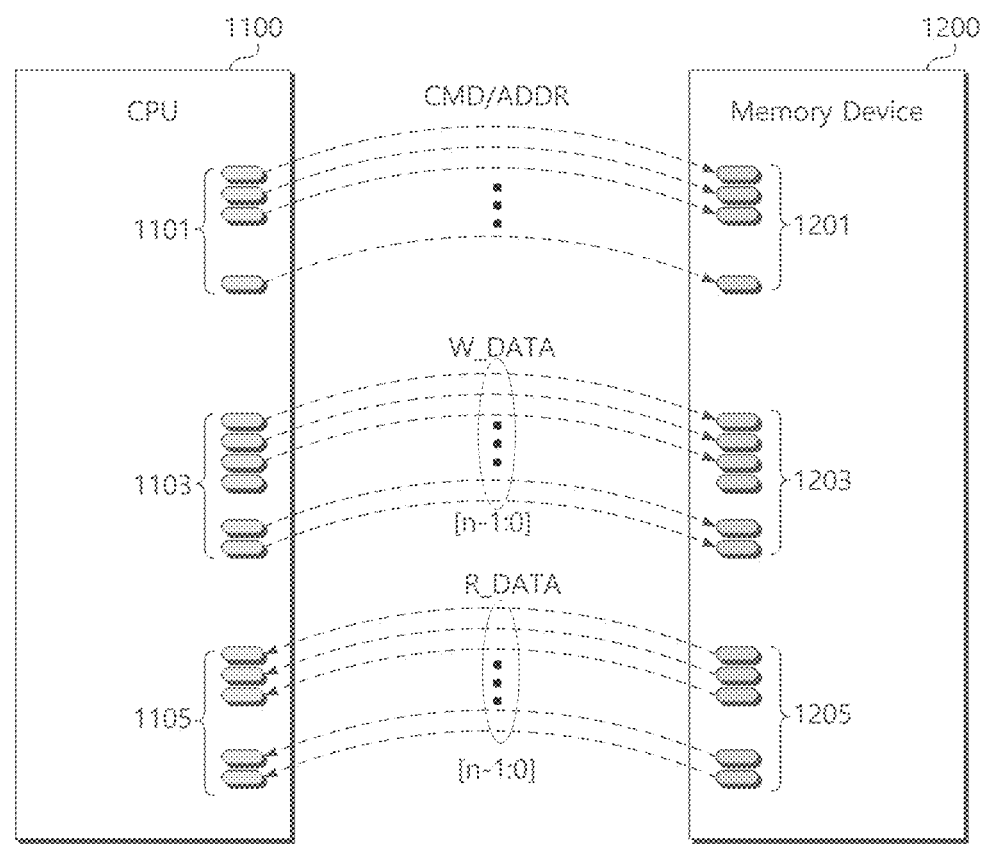
FIG. 3 is a diagram illustrating a method of configuring a pad of a CPU and a memory device according to an embodiment.

FIG. 3 is a diagram illustrating a method of configuring a pad of a CPU and a memory device according to an embodiment. Referring to FIG. 3, pads 1101, 1103, and 1105 of the CPU 1100 and pads 1201, 1203, and 1205 of the memory device 1200 are bonded using a hybrid copper bonding method.

The command/address transmission pads 1101 of the CPU 1100 are coupled to the command/address reception pads 1201 of the memory device 1200 to transmit a command CMD and an address ADDR. That is, as the upper surface of the CPU 1100 and the upper surface of the memory device 1200 are bonded, the command/address transmission pads 1101 and the command/address reception pads 1201 are bonded one-to-one. Each of the command/address transmission pads 1101 and command/address reception pads 1201 may be composed of a copper pad. Bonding surfaces other than the command/address transmission pads 1101 and the command/address reception pads 1201 may be filled with a diffusion barrier layer or an insulating material to provide insulation and bonding functions. When the command/address transmission pads 1101 and the command/address reception pads 1201 are bonded by a hybrid copper bonding HCB, the resistance and capacitive loads between the CPU 1100 and the memory device 1200 can be drastically reduced. Therefore, high-speed command and address transmission is possible.

The data transmission pads 1103 of the CPU 1100 are bonded to the data reception pads 1203 of the memory device 1200 to transmit write data W_DATA. That is, as the upper surface of the CPU 1100 and the upper surface of the memory device 1200 are bonded, the data transmission pads 1103 and the data reception pads 1203 are bonded one-to-one. Each of the data transmission pads 1103 and the data reception pads 1203 may be formed of a copper pad. In an input/output circuit or driver, the size of an active region of a PMOS transistor or an NMOS transistor must be guaranteed to ensure transmission reliability. Therefore, there is a limit to reducing the pitch of the pads. However, by using the hybrid copper bonding HCB, the transmission line is not loaded so much and the pitch between the pads can be sufficiently reduced. Therefore, the pitch of each of the data transfer pads 1103 can be sufficiently reduced as needed, and each of the data transfer pads 1103 of the CPU 1100 and the data reception pads 1203 of the memory device 1200 can be composed of n-bits. Here, 'n' may be the size (e.g., 512-bit) of a cache line of the CPU 1100. When the data transmission pads 1103 and the data reception pads 1203 are bonded together using a hybrid copper bonding HCB, mass transmission and high-speed transmission of write data W_DATA are possible due to reduction in resistive and capacitive loads.

The data reception pads 1105 of the CPU 1100 are bonded to the data transmitting pads 1205 of the memory device 1200 to receive the read data R_DATA. That is, as the upper surface of the CPU 1100 and the upper surface of the memory device 1200 are bonded together, the data reception pads 1105 and the data transfer pads 1205 are bonded one-to-one. Each of the data reception pads 1105 and data transmission pads 1205 may be formed of a copper pad. In an input/output circuit or driver, the size of an active region of a PMOS transistor or an NMOS transistor must be guaranteed to ensure transmission reliability. However, by using the hybrid copper bonding HCB is used, the transmission line is not loaded so much and the pitch between the pads can be sufficiently reduced. Accordingly, the pitch of each of the data reception pads 1105 and the data transmitting pads 1205 can be sufficiently reduced as needed. The number of data reception pads 1105 of the CPU 1100 and data transmission pads 1205 of the memory device 1200 may correspond to the size of a cache line (e.g., 512 bits). When the data reception pads 1105 and the data transmission pads 1205 are bonded together by a copper bonding method, mass transmission and high-speed transmission of the read data R_DATA are possible due to a reduction in resistance and capacitive load.

As described above, the pads 1101, 1103, and 1105 of the CPU 1100 and the pads 1201, 1203, and 1205 of the memory device 1200 may be bonded by a hybrid copper bonding HCB method. In this case, resistance and capacitive load between the CPU 1100 and the memory device 1200 can be drastically reduced. Therefore, a large amount and high-speed data transfer between the CPU 1100 and the memory device 1200 is possible.

Figure 4:
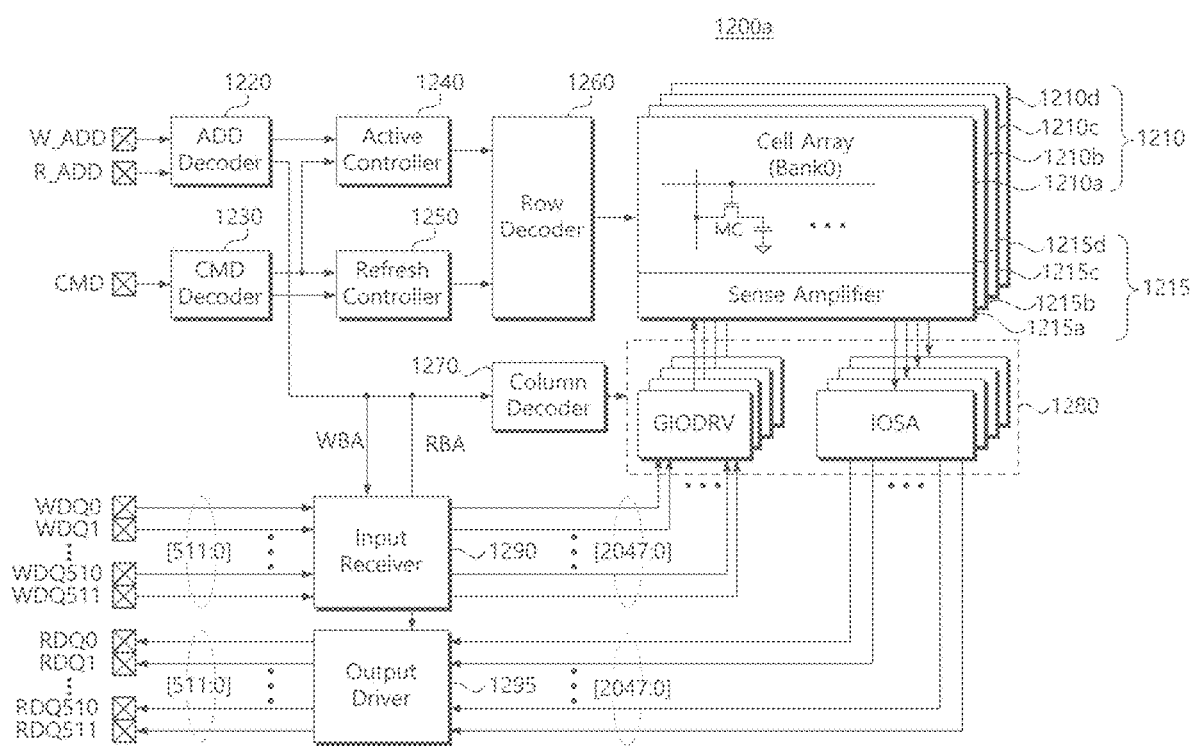
FIG. 4 is a block diagram illustrating a memory device according to an example embodiment.

FIG. 4 is a block diagram illustrating a memory device according to an example embodiment. Referring to FIG. 4, a memory device 1200a includes a cell array 1210, a sense amplifier 1215, an address decoder 1220, a command decoder 1230, an active controller 1240, a refresh controller 1250, a row decoder 1260, a column decoder 1270, a data read/write circuit 1280, an input receiver 1290, and an output driver 1295.

The cell array 1210 may provide stored data to the data read/write circuit 1280 through the sense amplifier 1215. Alternatively, the cell array 1210 may store the write data received from the data read/write circuit 1280 in the memory cells of the row and column selected through the sense amplifier 1215. In this case, the column decoder 1270 and the row decoder 1260 may provide memory cell addresses for data to be input/output to the cell array 1210. In particular, the cell array 1210 may include a plurality of banks 1210a, 1210b, 1210c, and 1210d. The cell array 1210 enables simultaneous access to a plurality of banks. For example, a write operation for one bank 1210a and a read operation for another bank 1210c may be concurrently performed.

The sense amplifier 1215 includes local sense amplifiers LSAs or bit line sense amplifiers BLSAs corresponding to the plurality of banks 1210a, 1210b, 1210c, and 1210d. See 1215a, 1215b, 1215c and 1215d in FIG. 4. The bit line sense amplifier BLSA may sense or write data stored in memory cells. The bit line sense amplifier BLSA may sense data stored in a memory cell using bit lines BLs. Data sensed and latched by the bit line sense amplifier BLSA is selected by the column select signal CSL. Data latched in the selected bit line sense amplifier BLSA is transferred to the local sense amplifier LSA through the local data line LIO. Also, data latched by the local sense amplifier LSA may be transferred to the input/output sense amplifier IOSA of the data read/write circuit 1280 through the global data line GIO. Also, the write data may be written into the memory cell from the global input/output driver GIODRV of the data read/write circuit 1280 via the local sense amplifier LSA and the bit line sense amplifier BLSA.

The address decoder 1220 receives a write address W_ADD or a read address R_ADD input through an address pad. A row address provided from the address decoder 1220 is provided to the active controller 1240 and the row decoder 1260. The column address provided by the address decoder 1220 is provided to the column decoder 1270. In particular, the bank addresses WBA and RBA included in the write address W_ADD or the read address R_ADD are transferred to the input receiver 1290 or the output driver 1295 and used for bank selection. That is, the global input/output driver GIODRV of the bank corresponding to write data input by the write bank address WBA is selected. Similarly, the input/output sense amplifier IOSA of the bank that outputs the read data is selected by the read bank address RBA.

Command decoder 1230 receives various commands. The command decoder 1230 decodes and provides commands to circuit blocks such as the column decoder 1270, the active controller 1240, and the refresh controller 1250. The command decoder 1230 may determine an input command by referring to externally applied signals (/RAC, /CAS, /WE). Alternatively, the command decoder 1230 may write data into a mode register set (MRS, not shown) according to an externally provided command and address. In particular, the command decoder 1230 can identify a read/write command R&W, a read command R, and a write command W. The command decoder 1230 recognizes read/write command R&W corresponding to multiple commands and activates read and write operations for multiple banks.

The active controller 1240 generates active addresses and active signals according to a write or read operation based on addresses and commands provided from the address decoder 1220 and the command decoder 1230 and provides them to the row decoder 1260.

When a refresh command is input to the memory device 1200, the refresh controller 1250 performs a refresh operation corresponding to the command. For example, when an all-bank refresh command is received, the refresh controller 1250 simultaneously refreshes all memory banks corresponding to the selected cell-row. When a per-bank refresh command is received, the refresh controller 1250 performs a refresh operation on a bank selected from among a plurality of memory banks through a bank address.

The row decoder 1260 controls the operation of the cell array 1210 through the provided active address, active signal, refresh active signal, and refresh address. During a read or write operation, row decoder 1260 activates the selected row or word line. During a refresh cycle, row decoder 1260 activates the row or word line selected by refresh controller 1250.

The column decoder 1270 activates a column of the data read/write circuit 1280 according to a column address provided through the address decoder 1220.

The data read/write circuit 1280 includes a global input/output driver GIODRV and input/output sense amplifiers IOSA. The global input/output driver GIODRV provides input data transmitted from the input receiver 1290 to the local sense amplifier LSA to be written into the selected memory cell of the selected bank via the global data line GIO. The input/output sense amplifier IOSA receives read data transmitted from the sense amplifier 1215 via the global data line GIO and transfers it to the output driver 1295.

The input receiver 1290 transfers write data transmitted through the write data pads WDQ0 to WDQ511 to the global input/output driver GIODRV of the selected memory bank in response to the write bank address WBA. For example, the input receiver 1290 transfers 512-bit wide write data to a global input/output driver GIODRV of a bank selected from among 2048-bit wide data lines as 512-bit wide. The structure of the input/output receiver 1290 will be described in detail in FIG. 5 to be described later.

The output driver 1295 selects an input/output sense amplifier IOSA of a bank selected from among a plurality of banks in response to the read bank address RBA. The selected 512-bit wide read data may be transferred to the outside of the memory device 1200a through the read data pads RDQ0 to RDQ511. A detailed structure of the output driver 1295 will be described in more detail in FIG. 6 to be described later.

Here, a deserializer is not included from the input receiver 1290 to the global input/output driver GIODRV. Also, a serializer does not need to be used between the output driver 1295 and the input/output sense amplifier IOSA. This is because the bit widths of the write data pads WDQ0 to WDQ511 and the bit widths (e.g., 512-bits) of the global input/output drivers GIODRV of each bank can be substantially the same. Also, the input/output sense amplifier IOSA and the read data pads RDQ0 to RDQ511 may have the same bit width (e.g., 512 bits).

According to the structure of the data line described above, the memory device 1200a enables high-speed data input/output, power performance, and chip area reduction. That is, in the memory device 1200*a*, data delay or power consumption caused by a deserializer or serializer and a chip area can be avoided.

Figure 5:
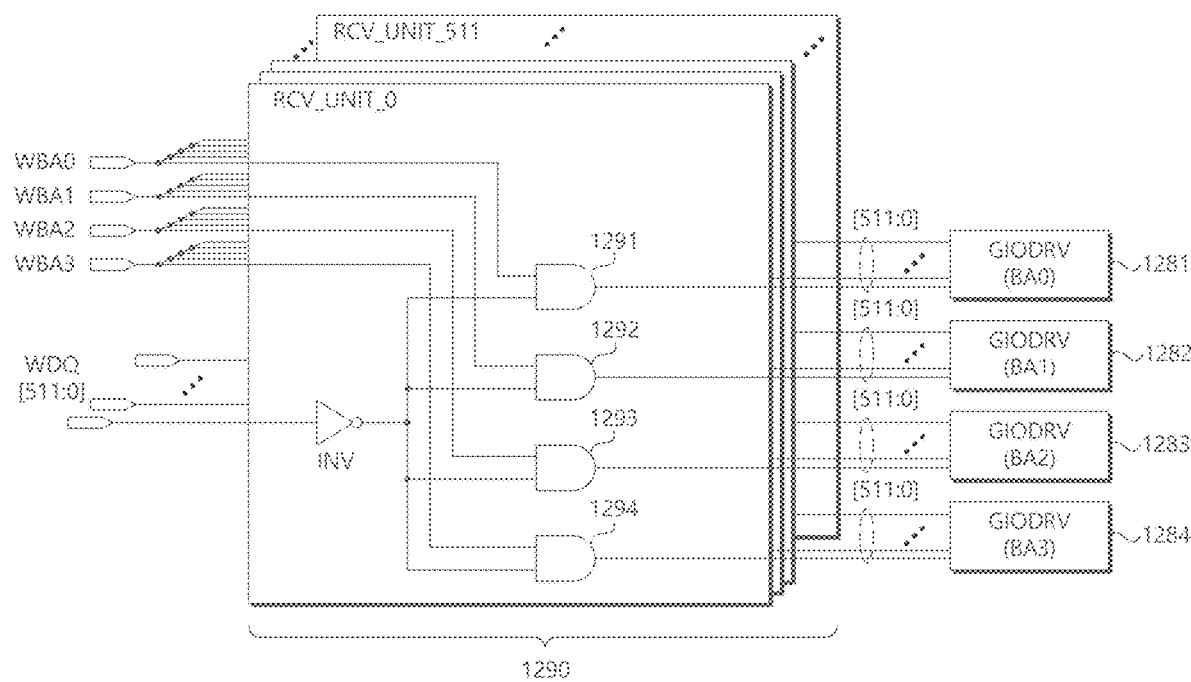
FIG. 5 is a circuit diagram briefly showing the structure of the input receiver of FIG. 4.

FIG. 5 is a circuit diagram briefly showing the structure of the input receiver of FIG. 4. Referring to FIG. 5, the input receiver 1290 transfers write data W_DATA input according to write bank addresses WBA0 to WBA3 to the global input/output driver GIODRV of the selected bank. Here, it is assumed that the input receiver 1290 has a bit width (e.g., 512-bits) the size of a cache line of the CPU 1100 and is connected to 4 banks per channel. However, embodiments are not limited to the disclosure herein.

The input receiver 1290 transfers 512-bit write data W_DATA transmitted through the write data pads WDQ0 to WDQ511 to the memory bank selected by the inputted write bank addresses WBA0 to WBA3. 512-bit write data (W_DATA) is transferred to 512 receiver units (RCV_UNIT [511:0]). Then, each of the receiver units (RCV_UNIT [511:0]) transfers the write data W_DATA to the global input/output driver GIODRV of the memory bank selected by one of the write bank addresses WBA0 to WBA3 activated.

For example, it is assumed that the write bank address WBA1 is input together with the write data W_DATA. Then, the AND gates 1291, 1292, 1293 and 1294 of each of the receiver units RCV_UNIT [511:0] are activated, and the 512-bit write data W_DATA is transferred to the global I/O driver 1282 of the memory bank BA1. Also see driver 1281 associated with memory bank BA0, driver 1283 associated with memory bank BA2 and driver 1284 associated with memory bank BA3. Then, the 512-bit write data W_DATA is loaded into the global data line GIO by the global input/output driver 1282 and written into the memory bank BA1 by the input/output sense amplifier IOSA.

Substantially, no separate configuration needs to be included between the write data pads WDQ0 to WDQ511 and the global input/output drivers 1281 to 1284 other than the input receiver 1290 for selecting a data path according to a bank address. That is, a parallelizer that parallelizes 8-bit or 16-bit input/output data DQ and transfers them to the global data line GIO can be removed. Accordingly, in the memory device 1200, delay or chip area cost caused by parallelization in a write data path may be reduced.

Figure 6:
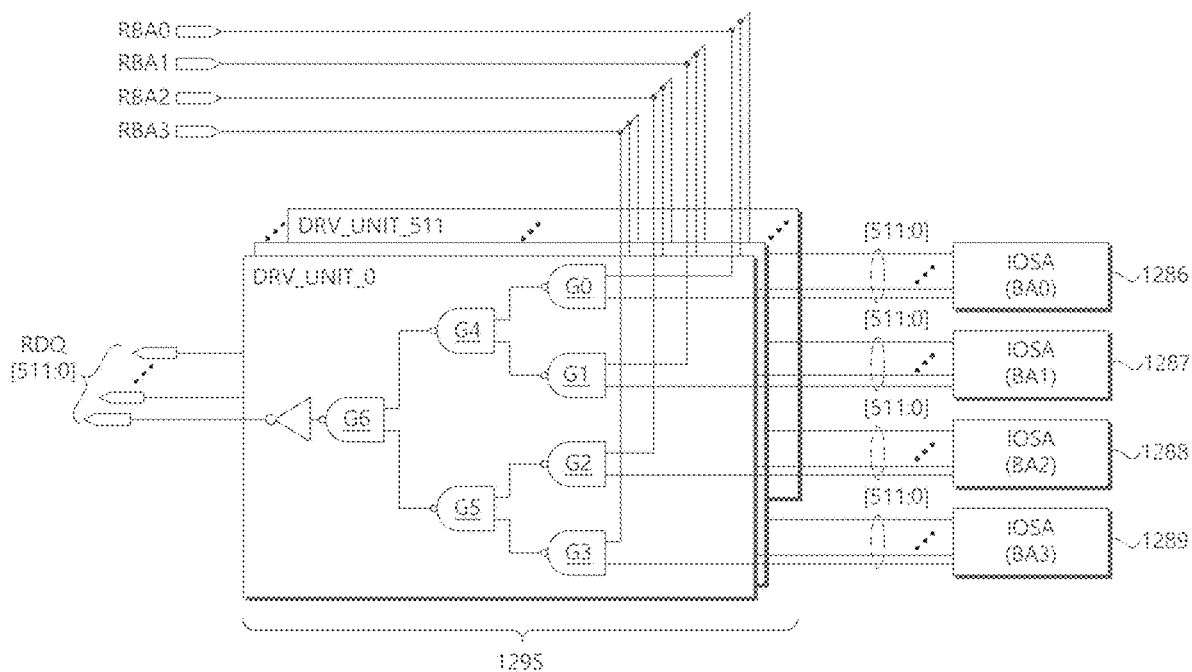
FIG. 6 is a circuit diagram briefly showing the structure of the output driver of FIG. 4.

FIG. 6 is a circuit diagram briefly showing the structure of the output driver of FIG. 4. Referring to FIG. 6, the output driver 1295 transfers read data R_DATA output from each bank to read data pads RDQ0 to RDQ511 according to read bank addresses RBA0 to RBA3. The output driver 1295 is fed by input/output sense amplifiers (IOSAs) 1286, 1287, 1288 and 1289 associated respectively with memory banks BA0, BA1, BA2 and BA3. Here, it is assumed that the output driver 1295 has a bit width (e.g., 512-bits) of the cache line size of the CPU 1100 and is connected to 4 banks per channel. However, embodiments are not limited to the disclosure herein.

The output driver 1295 selects 512-bit read data R_DATA transmitted from each of the plurality of banks BA0 to BA3 according to the read bank addresses RBA0 to RBA3 and transfers the selected data to the read data pads RDQ0 to RDQ511. The input/output sense amplifier IOSA sensing the data of any one of the plurality of banks BA0 to BA3 selected by the bank address transfers 512-bit read data R_DATA to the output driver 1295 side. Then, one of the NAND gates G0 to G3 of each of the output drive units DRV_UNIT_0 to DRV_UNIT_511 is activated according to the read bank address (one of RBA0 to RBA3) input from the CPU 1100. Also, the 512-bit read data R_DATA transferred to the activated NAND gate may be transferred to the read data pads RDQ0 to RDQ511.

Substantially, no separate configuration needs to be included between the input/output sense amplifier IOSA and the read data pads RDQ0 to RDQ511 other than the output driver 1295 for selecting a data path according to the read bank addresses RBA0 to RBA3. That is, a serializer for serializing 512-bit read data transmitted from the input/output sense amplifier IOSA into 8-bit or 16-bit input/output data DQ can be removed. Therefore, in the memory device 1200, delay or chip area cost caused by serialization in a read data path can be eliminated.

Figure 7:
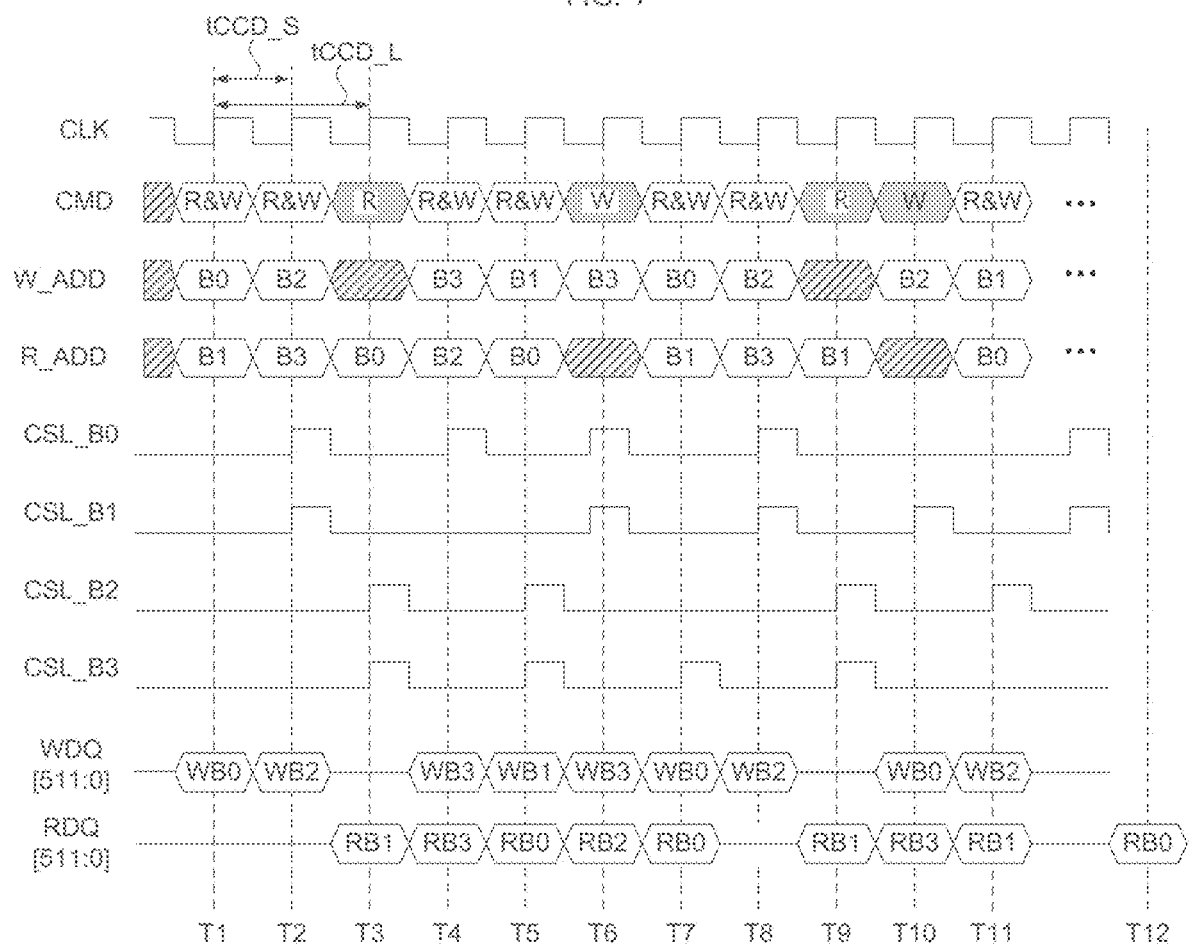
FIG. 7 is a timing diagram briefly showing examples of commands and data received by the memory device of an example embodiment.

FIG. 7 is a timing diagram briefly illustrating examples of commands and data input and output to and from the memory device over times T1, T2, T3, T4, T5, T6, T7, T8, T9, T10, T11 and T12.

Referring to FIG. 7, the memory device 1200 (see FIG. 4) may read or write cache line-sized data in a single data rate SDR scheme. Single data rate transfers data once per clock period; that is, SDR transfers data on either the rising edge of the clock or on the falling edge of the clock.

At time T1, the memory device 1200 receives a read/write command R&W, a write address B0, a read address B1, and write data WB0 from the CPU 1100. The write address B0 and the read address B1 include bank addresses B0 and B1, respectively. Then, the read/write command R&W, the write address W_ADD, and the read address R_ADD are decoded by the address decoder 1220 (see FIG. 4) and the command decoder 1230 (see FIG. 4), and transmitted to the input receiver 1290 and to the output driver 1295. The read/write command R&W is a multiple command that simultaneously requests a write operation of input write data WB0 and a read operation of a memory area corresponding to a read address R_ADD.

For a write operation by the read/write command R&W at time T1, the input receiver 1290 transmits 512-bit wide write data WB0 to the global data line GIO of the memory bank B0. Subsequently, when the column select signal CSL_B0 of the memory bank B0 is activated by the column decoder 1270 at time T2, the write data WB0 is written into the memory bank B0. As a result, a minimum delay tCCD_S from completion of decoding of a command until write data is written to the memory bank may be one clock cycle. Also, a delay tCCD_L from when a command is input to when write data is completely written to the memory bank may be two clock cycles.

For a read operation by the read/write command R&W at the time point T1, the bit line sense amplifier BLSA will sense the cells of the memory bank B1. Data sensed and latched by the bit line sense amplifier BLSA is selected by the column select signal CSL_B1 activated at the time point T2. Data latched in the selected bit line sense amplifier BLSA is transferred to the local sense amplifier LSA through the local data line LIO. Also, data latched by the local sense amplifier LSA may be transferred to the input/output sense amplifier IOSA of the data read/write circuit 1280 through the global data line GIO. 512-bit data latched in the input/output sense amplifier IOSA will be transferred to the read data pads RDQ0 to RDQ511 by the output driver 1295.

Read/write commands R&W, write address B2, read address B3, and write data WB2 input to the memory device 1200 at time T2 are processed according to the same procedure as the operation at time T1. For a write operation by the read/write command R&W at time T2, the input receiver 1290 transfers 512-bit wide write data WB2 to the global data line GIO of the memory bank B2. Subsequently, when the column select signal CSL_B2 of the memory bank B2 is activated by the column decoder 1270 at time T3, the write data WB2 is written into the memory bank B2.

For the read operation by the read/write command R&W at the time point T2, the bit line sense amplifier BLSA will sense the cells of the memory bank B3. Data sensed and latched by the bit line sense amplifier BLSA is selected by the column select signal CSL_B3 activated at time T3. Data latched in the selected bit line sense amplifier BLSA is transferred to the local sense amplifier LSA through the local data line LIO. Data latched from the local sense amplifier LSA will be transferred to the input/output sense amplifier IOSA through the global data line GIO. The 512-bit data RB3 latched in the input/output sense amplifier IOSA will be transferred to the read data pads RDQ0 to RDQ511 by the output driver 1295.

At time T3, the memory device 1200 receives a read command R and a read address B0 from the CPU 1100. The read command R and the read address B0 are decoded by the address decoder 1220 and the command decoder 1230 and transmitted to the output driver 1295. For a read operation according to the read command R, the bit line sense amplifier BLSA will sense the cells of the memory bank B0. Data sensed and latched by the bit line sense amplifier BLSA is selected by the column select signal CSL_B0 activated at time T4. Data latched in the selected bit line sense amplifier BLSA is transferred to the local sense amplifier LSA through the local data line LIO. Data latched from the local sense amplifier LSA will be transferred to the input/output sense amplifier IOSA through the global data line GIO. The 512-bit data RB0 latched in the input/output sense amplifier IOSA will be transferred to the read data pads RDQ0 to RDQ511 at time T5 by the output driver 1295.

For a write operation by the write command W at time T6, the input receiver 1290 transfers 512-bit wide write data WB3 to the global data line GIO of the memory bank B3. Subsequently, when the column select signal CSL_B3 of the memory bank B3 is activated by the column decoder 1270 at time T7, the write data WB3 is written into the memory bank B3.

As described above, the write data WB0 to WB3 and the read data RB0 to RB3 are independently input or output from the write data pads WDQ0 to WDQ511 and the read data pads RDQ0 to RDQ511, respectively. That is, write data WB0 to WB3 and read data RB0 to RB3 may be input and output in a full duplex manner. In addition, the write data WB0 to WB3 input to the write data pads WDQ0 to WDQ511 are written into the cell array 1210 without being processed by the parallelizer. Also, the read data RB0 to RB3 sensed by the cell array 1210 may be transmitted to the read data pads RDQ0 to RDQ511 without passing through the serializer.

Figure 8:
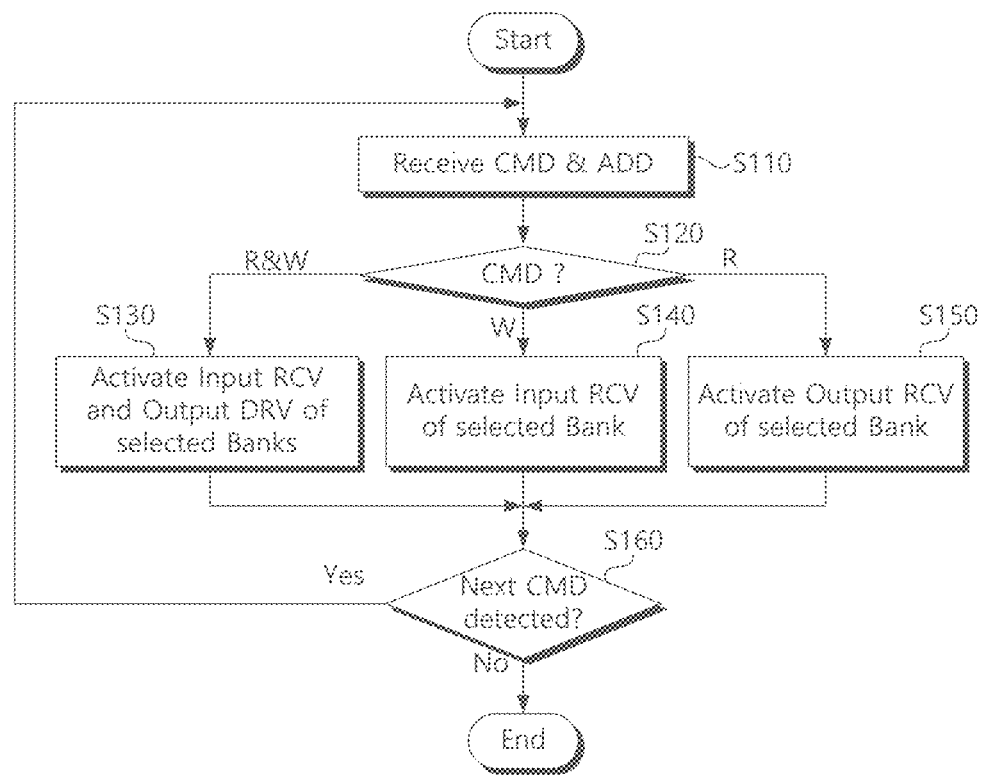
FIG. 8 is a flowchart exemplarily illustrating a command decoding operation of a memory device according to an embodiment.

FIG. 8 is a flowchart exemplarily illustrating a command decoding operation of a memory device according to an embodiment. Referring to FIG. 8, the memory device 1200 may decode commands including multiple command and select a corresponding control operation and data path.

In step S110, the memory device 1200 receives a command CMD and an address ADD from the CPU 1100. Here, the description of the command will be limited to an access command for writing or reading data. That is, the command may include a read/write command R&W, a read command R, and a write command W. When the read/write command R&W and the write command W are input, the write data W_DATA together with the address will be input to the write data pads WDQ0 to WDQ511.

In step S120, decoding of the command by the command decoder 1230 and operation branching according to the decoding result occur. If the input command is a read/write command R&W corresponding to multiple command, the procedure moves to step S130. If the input command is a write command W, the process moves to step S140. However, if the input command is a read command R, the procedure moves to step S150.

In step S130, the command decoder 1230 selects a data path of the input receiver 1290 (see FIG. 4) according to the bank address WBA included in the write address W_ADD. That is, the command decoder 1230 controls the input receiver 1290 to transfer the write data W_DATA input to the write data pads WDQ0 to WDQ511 to the global input/output driver GIODRV of the selected memory bank. At the same time, the command decoder 1230 selects a data path of the output driver 1295 (see FIG. 4) according to the bank address RBA included in the read address R_ADD. That is, the command decoder 1230 controls the output driver 1295 to transfer the read data R_DATA transmitted from the input/output sense amplifier IOSA of the selected memory bank to the read data pads RDQ0 to RDQ511.

In step S140, the command decoder 1230 selects a data path of the input receiver 1290 according to the bank address WBA included in the write address W_ADD. The command decoder 1230 controls the input receiver 1290 to transfer the write data W_DATA input to the write data pads WDQ0 to WDQ511 to the global input/output driver GIODRV of the selected memory bank.

In step S150, the command decoder 1230 selects a data path of the output driver 1295 according to the bank address RBA included in the read address R_ADD. That is, the command decoder 1230 controls the output driver 1295 to transfer the read data R_DATA transmitted from the input/output sense amplifier IOSA of the selected memory bank to the read data pads RDQ0 to RDQ511.

In step S160, an operation branch occurs depending on whether a subsequent command is detected. If, if the subsequent command no longer exists, the overall procedure is terminated. On the other hand, if a subsequent instruction is detected, the procedure returns to step S110 to continue the instruction decoding operation.

The command decoder 1230 can simultaneously receive read/write commands R&W in one command input cycle, and can also receive read addresses and write addresses at the same time. This is based on a complete duplex type data line structure in which transmission paths of write data W_DATA and read data R_DATA are separated.

Figure 9:
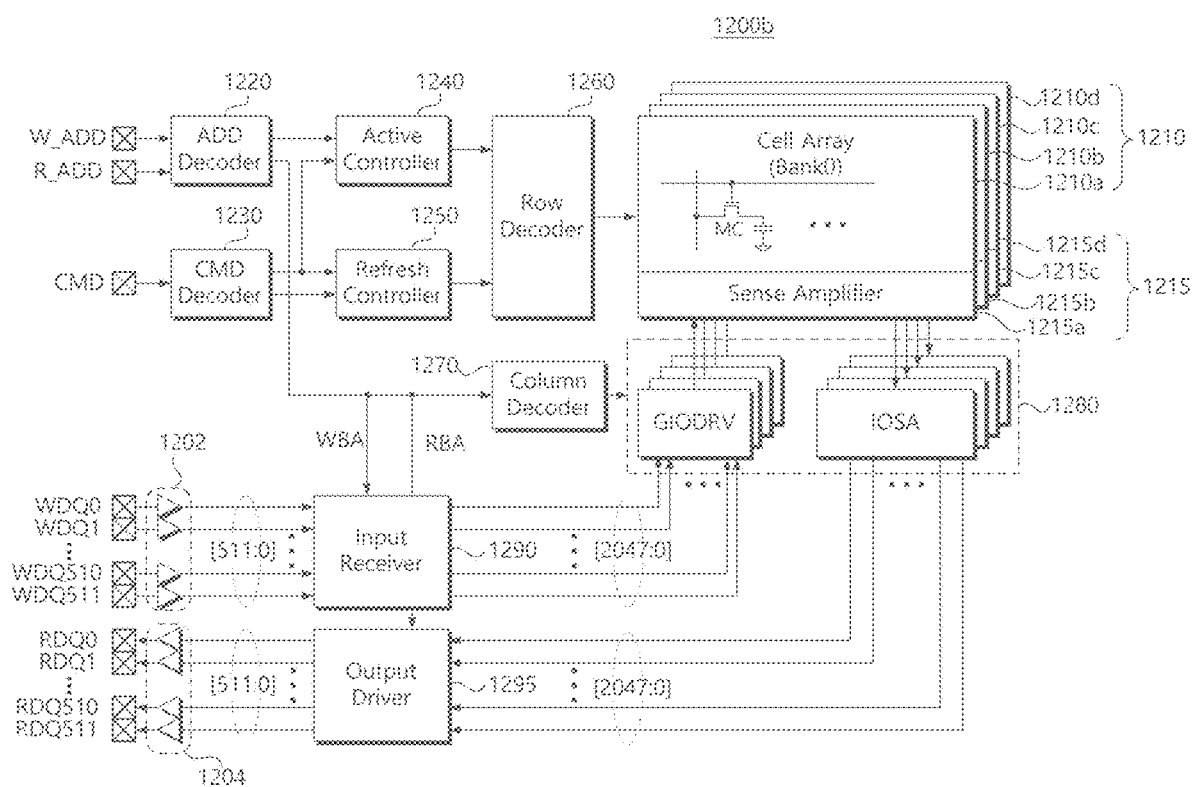
FIG. 9 is a block diagram showing a memory device according to another example embodiment of the present disclosure as an example.

FIG. 9 is a block diagram showing a memory device according to another example embodiment of the present disclosure as an example. Referring to FIG. 9, a memory device 1200b includes a cell array 1210, a sense amplifier 1215, an address decoder 1220, a command decoder 1230, an active controller 1240, a refresh controller 1250, and a row decoder. 1260, a column decoder 1270, a data read/write circuit 1280, an input receiver 1290, an output driver 1295, and a receive driver 1202 and a transmit driver 1204.

Here, the cell array 1210, sense amplifier 1215, address decoder 1220, command decoder 1230, active controller 1240, refresh controller 1250, row decoder 1260, column decoder 1270, The data read/write circuit 1280, input receiver 1290, and output driver 1295 are substantially the same as those of FIG. 4. Therefore, a description of these will be omitted.

In this embodiment, the receive driver 1202 is provided to the write data pads WDQ0 to WDQ511 to enhance the signal level of the input write data W_DATA. In addition, the transmission driver 1204 may be disposed to enhance the signal level of the read data R_DATA provided from the output driver 1295. In another embodiment, only the receiving driver 1202 may be formed on one side of the write data pads WDQ0 to WDQ511. For example, when it is necessary to enhance the digital signal level of the write data W_DATA transmitted from the CPU 1100, the reception driver 1202 may be provided. In another embodiment, only the transmission driver 1204 may be installed on one side of the read data pads RDQ0 to RDQ511.

The receiving driver 1202 and the transmitting driver 1204 may be selectively formed in the memory device 1200*b* to increase reliability of the write data W_DATA and the read data R_DATA. However, when the CPU 1100 and the memory device 1200*b* are coupled by hybrid copper bonding HCB, a digital signal transmitted from the CPU 1100 can be received without the reception driver 1202. In addition, digital read data R_DATA output from the memory device 1200*b* can also be transmitted to the CPU 1100 without the transmission driver 1204. Accordingly, the receive driver 1202 and the transmit driver 1204 may be optional components that may be formed as needed.

Figure 10:
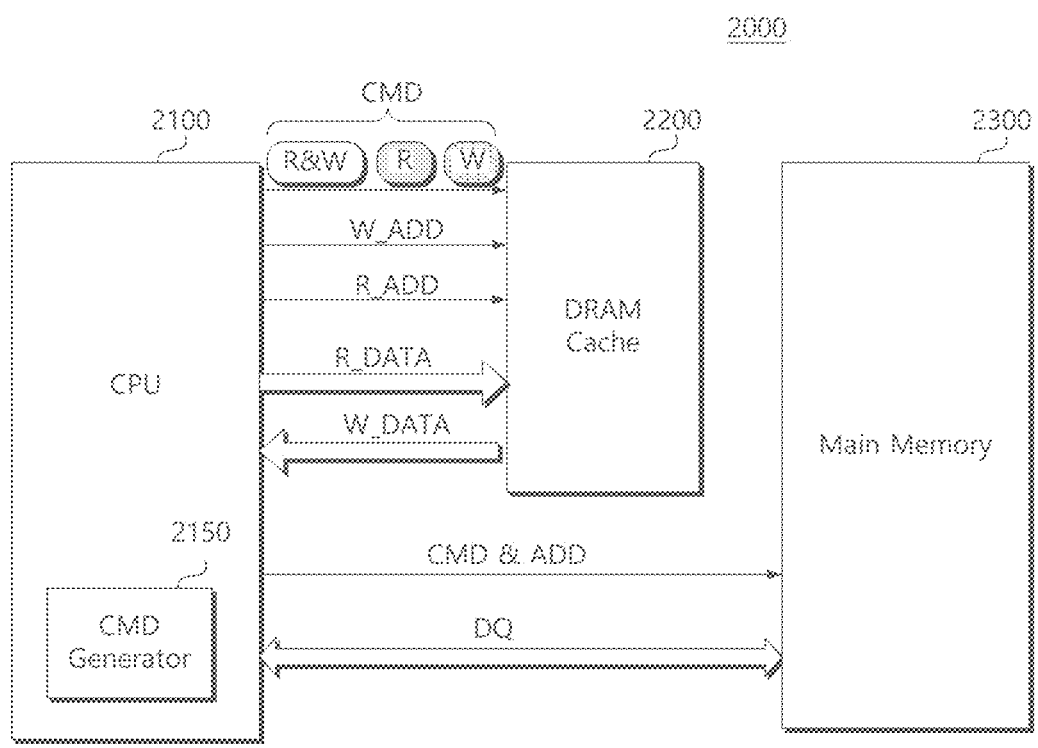
FIG. 10 is a block diagram showing a memory system according to still another embodiment.

FIG. 10 is a block diagram showing a memory system according to still another embodiment. Referring to FIG. 10, a memory system 2000 may include a CPU 2100, a DRAM cache 2200, and a main memory 2300.

The CPU 2100 may use the DRAM cache 2200 as a cache memory (e.g., L4 cache). The DRAM cache 2200 may be connected to the CPU 2100 through hybrid copper bonding HCB. That is, the DRAM cache 2200 has the same structure as the memory device 1200 shown in FIG. 4. The CPU 2100 generates a read/write command R&W, a read command R, and a write command W for accessing the DRAM cache 2200. For generation of instructions, the CPU 2100 may include an command generator 2150. The command generator 2150 generates a read/write command R&W, which is a multiple command including both a read request and a write request in one command.

When the read/write command R&W is provided, the read address R_ADD and the write address W_ADD are also provided to the DRAM cache 2200 at the same time. In addition, when the read/write command R&W is provided, the write data W_DATA will be provided to the DRAM cache 2200. To provide these functions, the CPU 2100 may completely separate the DRAM cache 2200 from a write data path and a read data path and independently operate the DRAM cache 2200. Also, the CPU 2100 will use the address lines separately according to the write address W_ADD and the read address R_ADD. Each of the write data path and the read data path may be implemented with, for example, 512 lines, the size of a cache line of the CPU 2100.

The DRAM cache 2200 outputs read data R_DATA requested by the CPU 2100 to the CPU 2100 or stores write data W_DATA requested by the CPU 2100 in a memory cell. In particular, the DRAM cache 2200 is electrically and physically connected to the CPU 2100 according to a hybrid copper bonding HCB scheme. Through such hybrid copper bonding HCB, the CPU 2100 and the DRAM cache 2200 may be packaged in a multi-stage stack with a minimized gap without conventional bumps and polymer layers.

The DRAM cache 2200 may receive multiple command that simultaneously request reading and writing through one command. That is, the DRAM cache 2200 can simultaneously receive one read/write command R&W, a read address R_ADD, a write address W_ADD, and write data W_DATA. The DRAM cache 2200 may simultaneously receive a read command R and a read address R_ADD for a read request. Similarly, the DRAM cache 2200 may simultaneously receive a write command W for a write request, a write address W_ADD, and write data W_DATA.

The DRAM cache 2200 has the above-described command structure and independent write data paths and read data paths to support full duplex input/output capable of simultaneously reading and writing. In addition, since the DRAM cache 2200 does not include a serializer and a deserializer for data input/output, data input/output latency can be reduced. In addition, it is possible to reduce the chip size of the DRAM cache 2200 and improve low-power performance by removing a serializer and a deserializer that occupy a relatively large area.

As the main memory 2300, DRAM having a general structure may be used. Alternatively, although not shown, the main memory 2300 may also be configured as a memory device capable of supporting full duplex having the same structure as the memory device 1200 shown in FIG. 4.

As described above, according to the DRAM cache 2200, data input/output latency can be reduced, and full duplex of read and write operations can be implemented by separating a write data path and a read data path. Accordingly, the memory bandwidth of the DRAM cache 2200 can be increased. In addition, the DRAM cache 2200 can achieve a reduced chip area and high power efficiency as components for serialization and parallelization are removed from the data input/output path.

Figure 11:
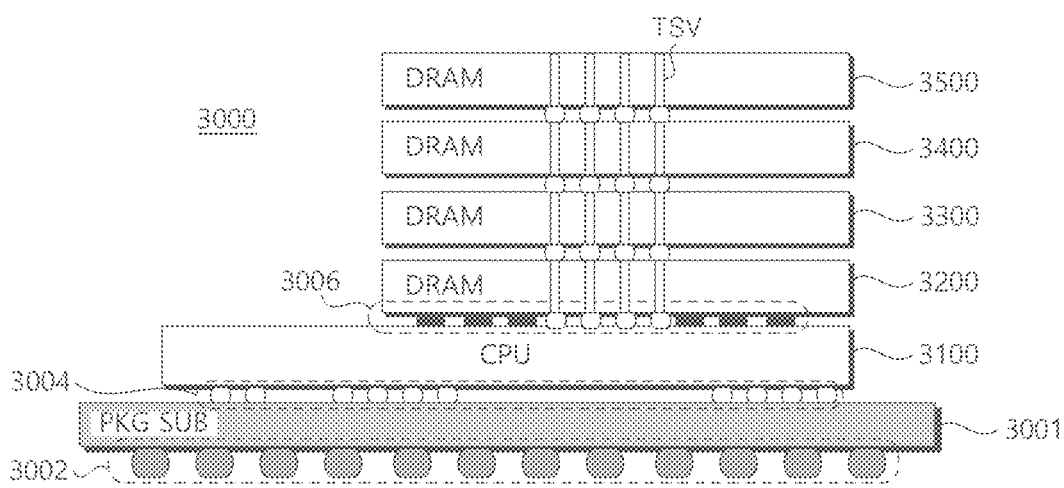
FIG. 11 is a cross-sectional view illustratively illustrating a stacked structure of a memory system according to another example embodiment of the present disclosure.

FIG. 11 is a cross-sectional view illustratively illustrating a stacked structure of a memory system according to another example embodiment of the present disclosure. Referring to FIG. 11, a memory system 3000 implemented as a stacked package may include a package substrate 3001, a CPU 3100, and memory devices 3200, 3300, 3400, and 3500.

The package substrate 3001 may serve as a channel electrically connecting devices stacked inside the memory system 3000 and external devices. To this end, bumps 3004 may be attached to an upper portion of the package substrate 3001 and solder balls 3002 may be attached to a lower portion of the package substrate 3001. For example, the bumps 3004 can be flip-chip bumps. The CPU 3100 may be stacked on the package substrate 3001 through the bumps 3004. The memory system 3000 may transmit and receive signals to and from other external packages or semiconductor devices through the solder ball 3002. For example, the package substrate 3001 may be a printed circuit board PCB.

The CPU 3100 may perform an operation using the memory devices 3200, 3300, 3400, and 3500 as a main memory or a cache memory. The CPU 3100 may execute applications supported by the memory system 3000 using the memory device 3200 stacked thereon. For example, the CPU 3100 may execute specialized operations by including at least one of a System on Chip (SoC), an Application Processor (AP), a Graphic Processing Unit (GPU), a Neural Processing Unit (NPU), a Tensor Processing Unit (TPU), a Vision Processing Unit (VPU), an image signal processor (ISP) and a digital signal processor (DSP). In another embodiment, the CPU 3100 may include a memory controller (not shown) for controlling the memory device 3200.

The memory device 3200 and the CPU 3100 may be connected according to a hybrid copper bonding 3006. Through the hybrid copper bonding 3006, existing bumps and polymer layers can be removed, stacking without vertical gaps is possible, and the overall package thickness of the memory system 3000 can be reduced. In addition, signal transmission speed between the memory device 3200 and the CPU 3100 may be improved. In particular, the memory device 3200 may operate as a cache memory of the CPU 3100.

To connect the CPU 3100 and the memory device 3200 through the hybrid copper bonding 3006, the memory device 3200 has a changed command combination and data path structure. That is, the memory device 3200 may receive multiple commands that simultaneously request reading and writing through one command. The memory device 3200 includes independent write data paths and read data paths. Accordingly, the memory device 3200 can support full duplex access capable of simultaneously reading and writing. In addition, since a serializer and a deserializer can be removed from an input/output data path, the latency of the memory device 3200 is reduced, the chip size is reduced, and a low-power design is provided.

The CPU 3100 and the memory devices 3300, 3400, and 3500 may be connected using through-silicon vias (hereinafter referred to as TSVs) and micro bumps. The memory devices 3300, 3400, and 3500 may be used as main memory of the CPU 3100. For example, the memory device 3100 may be used as the DRAM cache 2100 of FIG. 10, and the memory devices 3300, 3400, and 3500 may be used as the main memory 2300 of FIG. 10.

According to the structure of the data line described above, the memory device 3200 enables high-speed data input/output, power performance, and chip area reduction. That is, data delay, power consumption, and chip area caused by the arrangement of a deserializer or serializer are not required. In addition, since the data input/output width of the memory device 3200 can be formed by the cache line size of the CPU 3100, high input/output speed and cache management efficiency is provided when used as a cache memory.

The above are example embodiments. In addition to the above-described embodiments, simple design changes may be made. In addition, commonly known techniques can be used to modify the embodiments. Therefore, the scope of the claims provided below are not be limited to the above-described embodiments.

What is claimed is:
1. A semiconductor memory device comprising:
a cell array comprising a plurality of memory banks;
a command decoder configured to decode a read/write command, a read command, and a write command that are input from outside of the semiconductor memory device;
an address decoder receiving a read address and a write address;
an input receiver configured to transmit write data input through a write data pad to a global input/output driver of a first memory bank corresponding to the write address; and
an output driver configured to transmit read data output from an input/output sense amplifier of a second memory bank corresponding to the read address to a read data pad,
wherein the write data is input via the write data pad in a single data rate method and transmitted to the global input/output driver without deserialization processing, and the read data is transmitted from the input/output sense amplifier to the read data pad without serialization processing,
wherein the read data pad or the write data pad is electrically connected to a central processing unit by hybrid copper bonding,
wherein a first number of read data pads or a second number of write data pads corresponds to a cache line size of the central processing unit, and
wherein the read data pads comprise the read data pad and the write data pads comprise the write data pad.

2. The semiconductor memory device of claim 1, wherein the read address and the write address are transmitted to the address decoder through different address input pads.

3. The semiconductor memory device of claim 2, wherein the read/write command, the write address, the read address, and the write data are input during a same clock cycle.

4. The semiconductor memory device of claim 2, wherein the write command, the write address, and the write data are input during a same clock cycle.

5. The semiconductor memory device of claim 2, wherein the read command and the read address are simultaneously input during a same clock cycle.

6. The semiconductor memory device of claim 1, wherein each of the input receiver and the output driver transmits the write data and the read data independently in a full duplex manner.

7. The semiconductor memory device of claim 1, wherein the read/write command includes a read request and a write request at a same time.

8. A method of operating a semiconductor memory device connected to device central processing unit through hybrid copper bonding, the method comprising:
receiving a first command, a first write address, a first read address, and a first write data during a first clock cycle;
receiving a second command during a second clock cycle; and
outputting first read data corresponding to the first read address during the second clock cycle,
wherein a read data pad or a write data pad of the semiconductor memory device is electrically connected to the central processing unit by the hybrid copper bonding,
wherein a first number of read data pads or a second number of write data pads corresponds to a cache line size of the central processing unit, and
wherein the read data pads comprise the read data pad and the write data pads comprise the write data pad.

9. The method of claim 8, wherein the first command comprises a read request and a write request at a same time.

10. The method of claim 8, further comprising:
receiving a third command, a second write address, a second read address, and second write data during a third clock cycle; and
outputting second read data during the third clock cycle.

11. The method of claim 10, wherein the semiconductor memory device comprises:
a write data path for transmitting the first write data and the second write data from a write data pad to a memory cell array; and
a read data path for transmitting the first read data and the second read data from the memory cell array to the read data pad,
wherein the write data path and the read data path are managed independently of each other.

12. The method of claim 10, wherein the second command includes a first read request, and the third command includes a second read request and a write request at a same time.

13. A semiconductor memory device comprising:
a plurality of memory banks;

a command decoder configured to decode a read/write command, a read command, and a write command that are input from a central processing unit; and an input receiver configured to transmit write data input through a write data pad to a global input/output driver of a first memory bank corresponding to a write address, wherein the write data is input during a same clock cycle as the read/write command or the write command, and wherein the read/write command, the write address, a read address, and the write data are input during a same clock cycle.

14. The semiconductor memory device of claim 13, further comprising:

an output driver configured to transmit read data output from an input/output sense amplifier of a second memory bank corresponding to the read address to a read data pad.

15. The semiconductor memory device of claim 14, wherein a first number of the write data pads or a second number of the read data pads corresponds to a size of a cache line of the central processing unit, and wherein the read data pads comprise the read data pad and the write data pads comprise the write data pad.

16. The semiconductor memory device of claim 14, wherein the write data pad or the read data pad is connected to the central processing unit by a hybrid copper bonding.

17. The semiconductor memory device of claim 14, wherein the write data is transferred from the write data pad to the global input/output driver without deserialization processing, and wherein the read data is transferred from the input/output sense amplifier to the read data pad without serialization processing.

18. A semiconductor memory device comprising:

a cell array comprising a plurality of memory banks;

a command decoder configured to decode a read/write command, a read command, and a write command that are input from outside of the semiconductor memory device;

an address decoder receiving a read address and a write address;

an input receiver configured to transmit write data input through a write data pad to a global input/output driver of a first memory bank corresponding to the write address; and an output driver configured to transmit read data output from an input/output sense amplifier of a second memory bank corresponding to the read address to a read data pad, wherein the write data is equal in size to a single cache line once per a clock period and is input via the write data pad in a single data rate method and transmitted to the global input/output driver, and the read data is transmitted from the input/output sense amplifier to the read data pad, and wherein a size of the single cache line is a cache line size of a central processing unit connected to the semiconductor memory device.

* * * * *